United States Patent [19]
DeMeester et al.

[11] Patent Number: 5,289,128
[45] Date of Patent: Feb. 22, 1994

[54] SUPERCONDUCTING GRADIENT SHIELD COILS

[75] Inventors: Gordon D. DeMeester, Wickliffe; John L. Patrick, Chagrin Falls; Michael A. Morich, Mentor, all of Ohio

[73] Assignee: Picker International, Inc., Highland Hts., Ohio

[21] Appl. No.: 859,152

[22] Filed: Mar. 27, 1992

[51] Int. Cl.$^5$ ............................................ G01R 33/20
[52] U.S. Cl. ..................................... 324/318; 335/216
[58] Field of Search ............... 324/300, 307, 309, 318, 324/319, 320, 322; 335/216, 301

[56] References Cited

U.S. PATENT DOCUMENTS

| | | | |
|---|---|---|---|
| 4,587,504 | 5/1986 | Brown et al. | 335/216 |
| 4,703,275 | 10/1987 | Holland | 324/318 |
| 4,761,612 | 8/1988 | Holland et al. | 324/307 |
| 4,833,433 | 5/1989 | Schmettow et al. | 335/216 |
| 4,851,958 | 7/1989 | Takechi | 335/216 |
| 4,868,707 | 9/1989 | Takechi | 335/216 |
| 4,876,510 | 10/1989 | Siebold et al. | 324/318 |
| 4,896,129 | 1/1990 | Turner et al. | 335/299 |
| 5,045,826 | 9/1991 | Laskaris | 335/301 |
| 5,198,769 | 3/1993 | Frese et al. | 324/318 |

FOREIGN PATENT DOCUMENTS

| | | |
|---|---|---|
| 210289A1 | 2/1987 | European Pat. Off. . |
| 340860A1 | 12/1988 | European Pat. Off. . |
| 293723A3 | 11/1989 | European Pat. Off. . |
| 433002A3 | 6/1991 | European Pat. Off. . |
| 2646467 | of 0000 | Fed. Rep. of Germany . |
| 52-90293 | of 0000 | Japan . |

Primary Examiner—Michael J. Tokar
Attorney, Agent, or Firm—Fay, Sharpe, Beall, Fagan, Minnich & McKee

[57] ABSTRACT

An examination region (12) is defined within the bore of a superconducting magnet assembly (10). An RF coil (22) and gradient magnetic field coils (14) are disposed within the bore of the superconducting magnet assembly around the examination region. The superconducting magnet includes a hollow, cylindrical vacuum vessel (40). An annular, liquid helium holding low temperature reservoir (60) extends centrally through the vacuum vessel, but is sealed therefrom such that liquid helium is not drawn into the vacuum. A plurality of annular superconducting magnets (56) are received in the low temperature reservoir immersed in the liquid helium. A first cold shield (44) and a second cold shield (50) are mounted in the vacuum vessel surrounding the low temperature reservoir. A main magnetic field shield coil (66) is disposed in the low temperature reservoir outside of the annular superconducting magnets for canceling the magnetic field generated by the annular magnets surrounding the magnet. A gradient shield coil (70) is mounted in low temperature reservoir inside the annular superconducting magnets to cancel magnetic fields generated by the gradient magnetic field coils in the region beyond the gradient shield coil. The gradient shield coil is electromagnetically coupled to the gradient field coils to be driven by magnetic fields emanating therefrom. Optionally, the gradient shield coil can be constructed of a higher temperature superconducting material and disposed in association with one of the cold shields.

17 Claims, 3 Drawing Sheets

SUPERCONDUCTING GRADIENT SHIELD COILS

BACKGROUND OF THE INVENTION

The present invention relates to superconducting magnets. It finds particular application in conjunction with superconducting magnets used in magnetic resonance imaging apparatus and will be described with particular reference thereto. It is to be appreciated, however, that the invention will also find application in other low temperature magnets in applications in which eddy magnetic fields are undesirable, such as nuclear magnetic resonance spectrometers and the like.

Magnetic resonance imaging systems superpose three magnetic fields over an imaging volume. A superconducting magnet is commonly used to provide a spatially large as well as a temporally and spatially constant main magnetic field. This main field is referred to as the $B_O$ field and is usually between 0.5 to 2.0 Tesla within an imaging volume of 50 cm diameter. A second magnetic field changes with time and has spatial linear $\partial B_z/\partial x$, $\partial B_z/\partial y$, $\partial B_z/\partial z$ gradients for spatial encoding that are aligned with the $B_O$ field. These are typically in the range of $+/-$ 10 mT/m. Transverse to the direction of these two fields is an RF magnetic field used for magnetization reorientation during the NMR experiment.

In a conventional MRI magnet system, a set of $B_O$ field generating coils are configured in such a way that they provide only about a 10 micro Tesla variation within the 50 cm diameter imaging sphere. The coils are typically superconductors operating at a temperature near that of liquid helium, 4.2° K. Typically, between six and eleven superconducting coils are series connected and immersed in a common liquid helium reservoir. In order to minimize the heat gain of the magnet from the room temperature environment, a cryostat is provided. The cryostat is an evacuated container to eliminate convective heat transfer. The magnet is immersed in a liquid helium bath at 4.2° K. and near atmospheric pressure. Between these two containers two cold shields are suspended. One is cooled to about 10°-20° K. by refrigeration and/or the boil off helium gas. The other is typically cooled to about 77° K. Several layers of aluminized mylar minimize the radiative heat transfer. The 77° K. cold shield is either maintained by the boil off of liquid nitrogen or by mechanical refrigeration which can cool it to 60°-70° K. There is also a conductive heat transfer in the suspension members of these internal structures. This is, of course, minimized by design. The cryostat design is thus optimized to provide for a minimum heat gain and thus a minimum helium boil off.

A conventional MRI system surrounds the patient or part of the patient with an RF coil, then the gradient field coil, and finally the room temperature bore of the magnet. Although the cryostat does in general provide an excellent barrier to heat transfer, it also provides electrically conductive materials to support eddy currents from the time changing gradient fields. The magnetic fields resulting from these eddy currents may be substantial and require correction. Conventionally, this is done electrically with pre-emphasis. However, the most effective method is not to create the eddy currents in the first place rather than correcting for them after they are created. This is done with self shielded gradients which consist of a primary set of coils at a first radius as well as a secondary or shield set of coils at a second radius. The design of these coils is such as to minimize the eddy currents at the position of the magnet cold shields as described in U.S. Pat. No. 4,896,129 to Turner, et al. The efficiency of the self shield gradient is strongly influenced by the ratio of the shield coil and primary coil radii, because one partially cancels the field of the other over the imaging volume, in addition to cancelling fields outside of the coils.

There are three general types of superconducting magnets, unshielded, passively shielded, and actively shielded. By design, an unshielded magnet makes no provision to control the field external to the magnet. A passively shielded magnet is designed with iron close to the magnet so as to reduce the spatial extend of the magnet's field. An actively shielded magnet is designed with inner and outer coils (like the self shielded gradient) to minimize the magnetic field outside of the magnet. A hybrid magnet may use some active and some passive shielding. All of these types of magnets require a shimset in order to reach the desired level of homogeneity in the patient volume. A set of Garrett coils can be made to provide the additions to the main field to make the main field more uniform. Some of the coils of this shimset, either superconductive or resistive, can couple to the gradient coil, as does the shield coil of the self shielded gradient. To eliminate these interactions and reduce cost, most MRI systems now have a passive (iron) only shimset. This shimset is located in the room temperature bore of the magnet in the vicinity of the gradient coil.

More specifically, the first or higher temperature cold shields which are traditionally disposed along the patient bore and outside diameters of the vacuum chamber are cooled with liquid nitrogen to about 77° K. For example, a cylindrical liquid nitrogen reservoir is provided inside the vacuum chamber around the outside of the superconducting magnet. The reservoir is thermally connected with a cylinder around the bore and disks at the edges, such that the nitrogen reservoir is cooled by conduction. However, this liquid nitrogen cooling is commonly replaced with mechanical refrigeration. The mechanical refrigeration unit is thermally connected with a copper or aluminum cylinder disposed adjacent the interior diameter of the vacuum chamber and another aluminum or copper cylinder disposed adjacent the outer diameter of the vacuum chamber. The mechanical refrigeration cools these cylinders to a temperature around 60°-70° K., the two cylinders being thermally linked at each end by disks.

To reduce the heat transport, second or inner cold shields are commonly disposed between the first cold shields and the liquid helium vessel. The second cold shields includes one copper or aluminum cylinder disposed between the inner diameter of the superconducting magnets and the inner cylinder of the first cold shield and a second copper or aluminum cylinder disposed between the outer diameter of the superconducting magnets and the outer cylinder of the first cold shield. The cylinder is thermally connected by disks at opposite ends. The second cold shield is thermally connected, such as by thermally conductive metal straps, with a second stage of the refrigeration unit which cools it to about 20° K. Again, the cylinders are surrounded inside and out by layers of the super insulation.

A gradient field coil is disposed in the bore displaced from the inner wall of the cryostat for selectively generating magnetic field gradients across an imaging region in the bore. Typically, the gradient magnetic fields are applied for short durations, sufficiently short that they might more aptly be referenced as magnetic field gradient pulses. The gradient magnetic field pulses, particularly the rising and falling edges of the gradient field pulses, induce voltages in surrounding electrically conductive structures which, in turn, cause eddy currents. That is, eddy currents are generated in the magnet formers, the shimming coils, the liquid helium reservoir, the cold shields, and the like. At the very low resistance found at these temperatures, the eddy currents can persist for periods in excess of the repeat time of the magnetic resonance sequence. The generated eddy currents are very complex, varying with frequency, temperature, thickness of the electrically conductive structure, and the like. These generated eddy currents, in turn, generate eddy magnetic fields in the imaging region in the bore of the magnet. These eddy magnetic fields disrupt the precise magnetic fields that make for good quality, high resolution magnetic resonance imaging.

One technique for compensating for the eddy magnetic fields is through pre-emphasis. During initial pre-emphasis calibration, the contribution from the eddy magnetic fields are determined and the current pulses for generating the gradient magnetic fields adjusted accordingly. More specifically, the currents used to generate the gradient magnetic fields are adjusted such that the generated gradient field and the eddy magnetic field sum to produce the desired magnetic field in the image region. See for example, U.S. Pat. No. 4,761,612 issued Aug. 2, 1988 to Holland and Stauber entitled "Programmable Eddy Current Correction", and U.S. Pat. No. 4,703,275 issued Oct. 27, 1987 to Holland entitled "Method and Apparatus to Compensate Eddy Currents in Magnetic Resonance Imaging". Although pre-emphasis is effective, it does not completely correct for the complex gradient magnetic fields. The generated eddy magnetic field is very complex and cannot always be completely compensated for with a linear gradient.

One technique for reducing the eddy magnetic fields is to install a self-shielded gradient coil within the warm bore of the superconducting magnet. The self-shielded gradient coils include a gradient coil and a surrounding active shielding coil. The shielding coils are designed to cancel the gradient magnetic field at the positions of the cold shields to prevent inducing eddy currents, hence eddy magnetic fields. However, the shield coils generally require a diameter that is about 1.3 times the diameter of the primary gradient coil. This either reduces the size of the usable bore within the gradient coil or requires a larger, more expensive superconducting magnet. For medical diagnostic imaging, the minimum size of the bore is generally dictated by the dimensions of the human torso, hence reducing the useful bore size is undesirable.

The present invention contemplates a new and improved gradient shielding coil which overcomes the above-referenced problems and others.

SUMMARY OF THE INVENTION

In accordance with the present invention, a new and improved superconducting magnet assembly is provided in which superconducting gradient shield coils are disposed within the cryostat.

In accordance with a more limited aspect of the present invention, the gradient shield coil is disposed in the helium reservoir of the main field magnets.

In accordance with another aspect of the present invention, the gradient shield coil is inductively coupled with the gradient coil.

In accordance with another more limited aspect of the present invention, the superconducting magnet is incorporated in a magnetic resonance imaging apparatus.

One advantage of the present invention is that it maximizes the patient aperture in a magnet with a minimized diameter.

Another advantage of the present invention is that it reduces magnet diameter.

Another advantage of the present invention is that it simplifies pre-emphasis correction.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components, and in various steps and arrangements of steps. The drawings are only for purposes of illustrating a preferred embodiment and are not to be construed as limiting the invention.

DETAILED DESCRIPTION OF THE PREFERRED EMBODIMENTS

Figure 1:
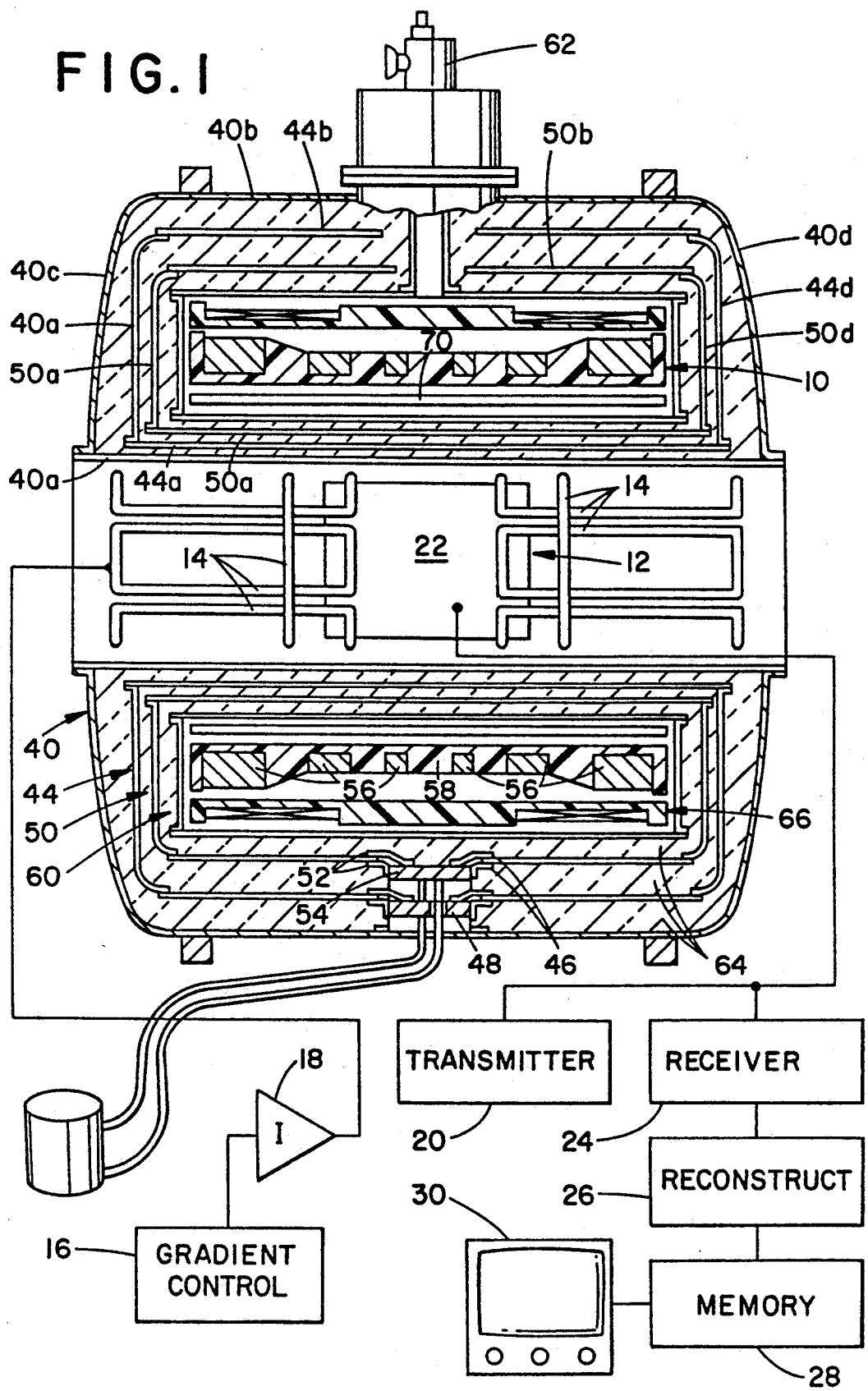
FIG. 1 is a vertical cross-sectional view of a magnetic resonance imaging apparatus through the vacuum envelope and various interior layers of a superconducting magnet.

With reference to FIG. 1, a superconducting, main magnet field coil assembly 10 generates a substantially uniform magnetic field longitudinally through an examination region 12. A gradient magnetic field means selectively creates gradient magnetic fields across the examination region 12. The gradient magnetic field means includes gradient magnetic field coils 14 arranged symmetrically on either side of the examination region 12. A gradient magnetic field control means 16 controls a current pulse generator 18 to apply current pulses with appropriate characteristics to the gradient field coils to cause a desired magnetic field pulse to be generated.

A resonance excitation and manipulation means includes a radio frequency transmitter 20 for generating radio frequency pulses of the appropriate frequency spectrum for inducing resonance of selected dipoles disposed in the examination region 12. The radio frequency transmitter is connected with a radio frequency antenna 22 disposed surrounding the examination region and inside the main magnetic field magnet 10. The RF coil 22 transmits radio frequency pulses into the region of interest, and receives radio frequency resonance signals emanating therefrom. Alternately, a separate receiving coil may be provided. The received magnetic resonance signals are conveyed to a radio frequency receiver 24. Demodulated received radio frequency signals are digitized and reconstructed into a magnetic resonance image representation by an array processor or other means 26. The reconstructed image representation is stored in a memory 28. The image representation may be displayed on a video monitor 30, subject to further processing, stored on disk, or the like.

The superconducting magnet assembly 10 includes a vacuum vessel 40 Which includes an inner cylindrical room temperature bore 40a, an outer wall 40b around the outer diameter of the assembly, and annular end walls 40c and 40d. A port is provided for initially evacuating the tubular vacuum vessel 40.

A first cold shield 44 includes an inner cylindrical shield assembly 44a in the inner bore of the magnet adjacent the bore wall 40a of the vacuum vessel, and an outer cylindrical assembly 44b adjacent the outer diameter wall 40b of the vacuum vessel. Preferably, the first cold shield 44 further includes annular end wall shield assemblies 44c and 44d. The first cold shield inner and outer cylinders, in the preferred embodiment, are each constructed of a dielectric former, such as a cylinder of glass reinforced plastic, with a thermally conductive coating, such as copper, aluminum, diamond, or other ceramic films. If the thermally conductive coating is electrically conductive, it includes a plurality of longitudinal dividers to reduce electrical conductivity. The first cold shield is connected by an array of thermal conductors 46, such as braided strips of copper, aluminum, or other highly conductive materials to a first heat sink 48 which is refrigerated to about 60°-70° K.

A second cold shield 50 includes an inner cylindrical shield assembly 50a disposed adjacent the first cold shield in shield assembly 44a and an outer cylindrical shield assembly 50b disposed adjacent the first cold shield outer cylindrical shield assembly 44b. Preferably, annular ends 50c and 50d complete the thermal containment. The second cold shield is constructed analogous to the first cold shield. The second cold shield 50 is connected by thermally conductive cables or other means 52 with a second heat sink 54 which is refrigerated to about 20° K. or less.

Preferably, a helium working gas is compressed at a remote location by mechanical means. The helium is conveyed to a cold head within which the first and second heat sinks are located. The compressed, helium is allowed to expand in a two stage process removing heat from the heat sinks.

A plurality of superconducting, annular magnet coils 56 mounted on a dielectric former 58 are disposed within a low temperature reservoir 60 inside of the second cold shield 50. The low temperature reservoir 60 is sealed from the remainder of the vacuum vessel 40 such that it holds the superconducting magnets immersed in liquid helium without the helium escaping into the evacuated region. A helium port 62 permits the low temperature reservoir 60 to be maintained filled with liquid helium as it evaporates to hold the temperature in the helium vessel 60 at about 4.2° K. Optionally, a helium recovery and recirculating system (not shown) may be connected with the helium port 62 to recover evaporating helium, recondense it to liquid, and refill the helium reservoir 60. Layers 64 of insulation, preferably aluminized mylar, are disposed between the vacuum vessel walls and the first cold shield, between the first and second cold shields, and between the second cold shield and the helium reservoir.

A superconducting main field shield coil assembly 66 is mounted in the helium reservoir around the exterior of the superconducting main magnets 56 and electrically in series therewith. The main field shield coil generates the magnetic field which oppose the fields generated by main magnets 56 exterior to the cryostat. Preferably, the superconducting coils 56 and 66 interact to produce a strong uniform magnetic field in the bore with substantially no magnetic field external to the bore.

A superconducting gradient shield coil 70 is mounted in the helium reservoir 60 on the bore side of the main superconducting magnets 56. The gradient shield coil is inductively coupled to the gradient coil assembly 14 such that the rising edge of each gradient magnetic field pulse induces current flow in the gradient shield coil 70. The falling edge of the gradient magnetic field pulse generates an equal and opposite current in the gradient shield coil extinguishing superconducting flow therein. The pattern of the superconducting shield coil is such that the structures exterior to its periphery do not see the fields from the gradient coil 14. That is, the winding pattern of the superconducting gradient shield coil is such that the induced currents generate a magnetic field that is substantially equal and opposite to the magnetic field generated by the gradient field coils exterior to the shield coil's periphery. In this manner, it prevents eddy currents from being induced in the main magnets and other more radially remote structures.

Figure 2:
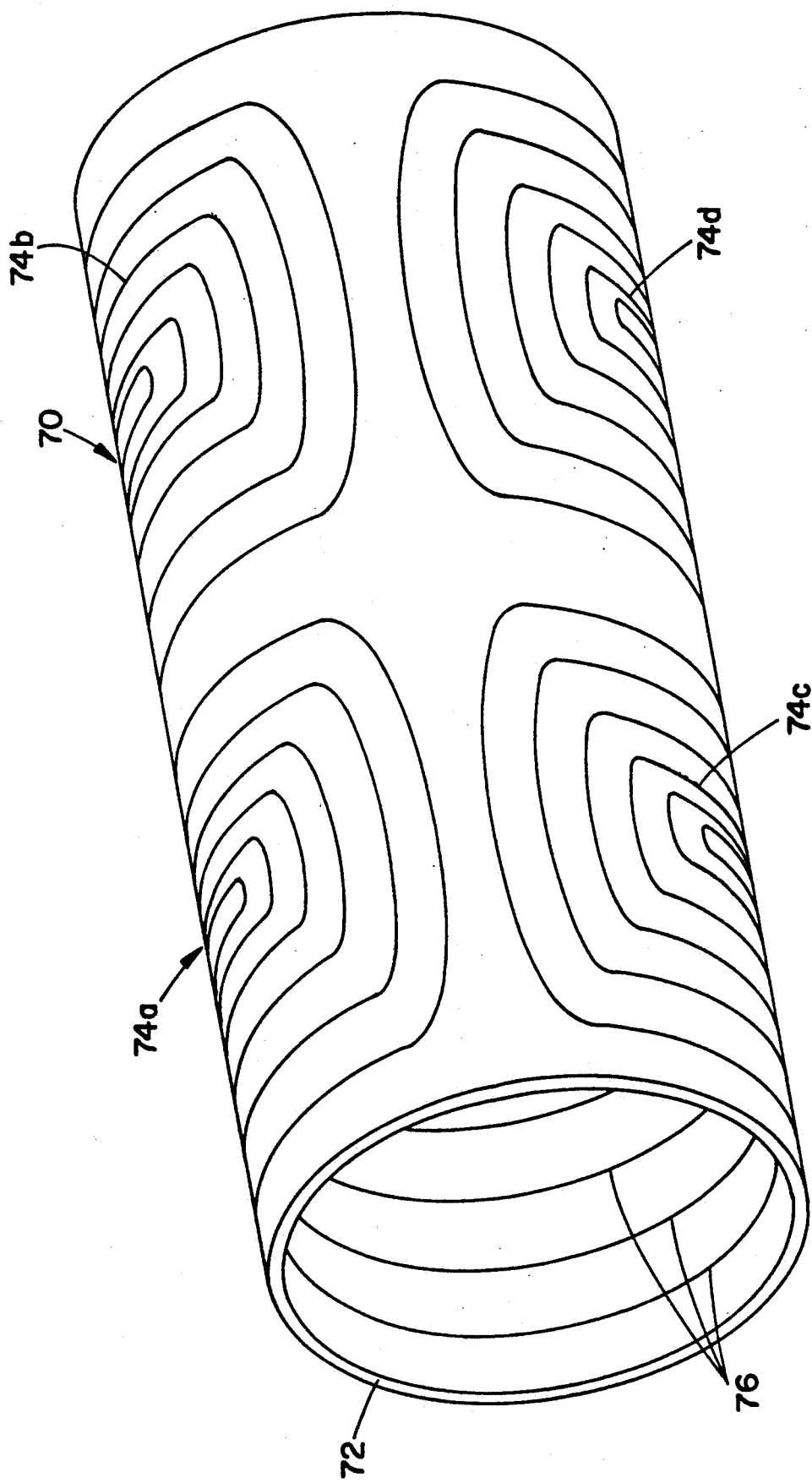
FIG. 2 is a perspective view of the gradient shield coil of FIG. 1.
Figure 3:
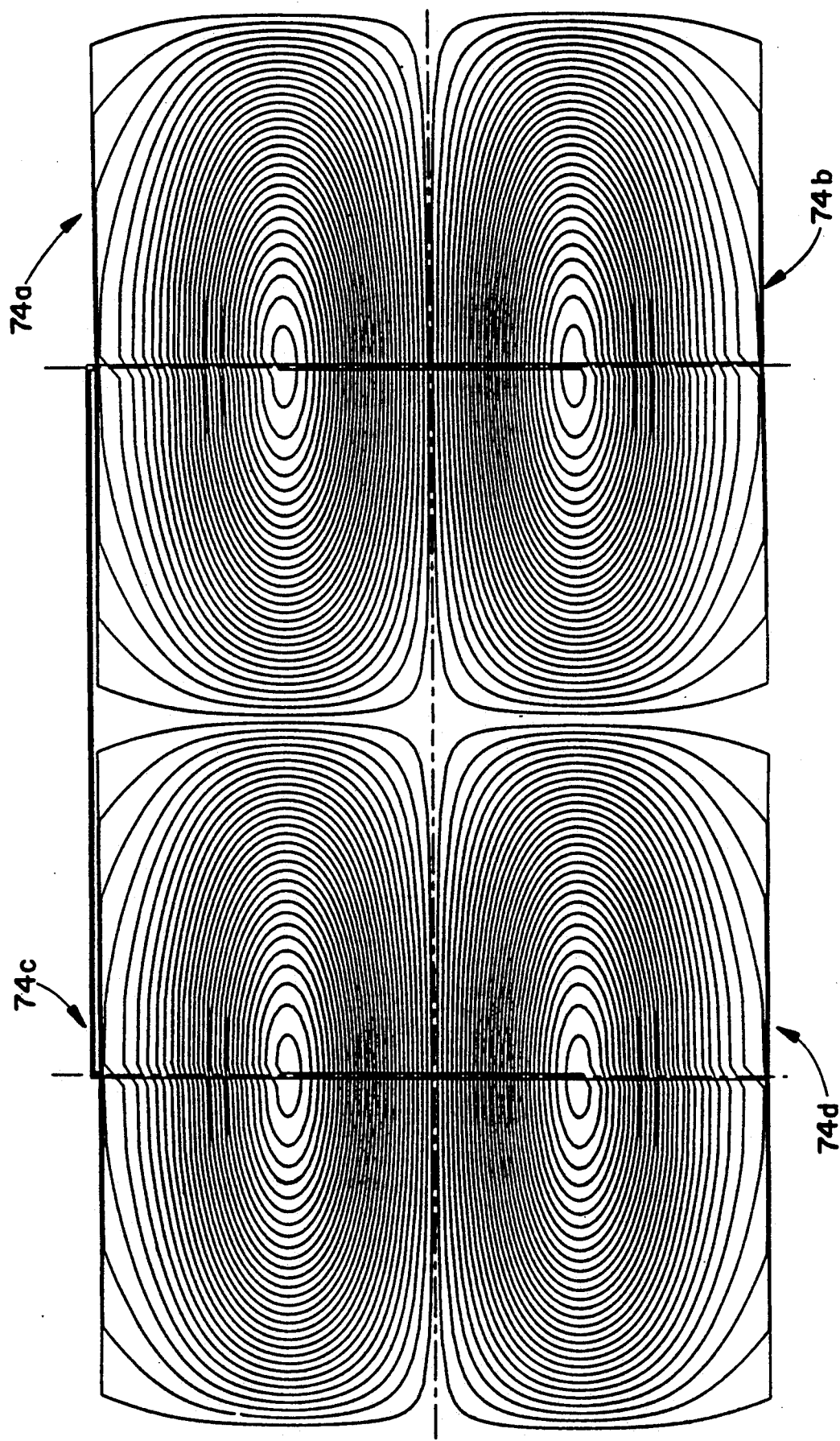
FIG. 3 is a diagrammatic illustration of a preferred gradient shield for gradients orthogonal to the longitudinal axis of the superconducting magnet assembly opened flat for simplicity of illustration.

With reference to FIG. 2, the superconducting gradient shield coil includes a support cylinder or former such as glass-reinforced plastic 72. A low temperature superconductor is deposited on the former in four symmetric, spiral patterns 74a, 74b, 74c, and 74d. With particular reference to FIG. 3, the four spirals are interconnected such that current flow in longitudinally adjacent spirals 74a, 74b and 74c, 74d flow in opposite directions; also, circumferentially aligned spirals 74a, 74c or 74b, 74d have current flow in opposite directions. For example, the current flow in spirals 74a and 74d may both be clockwise or counterclockwise, while the current in loops 74b and 74c are counterclockwise or clockwise. For simplicity of manufacture, the coils may be deposited on a thin flexible film and then adhered to the dielectric former 72. Alternately, a cylindrical NbTi or other superconducting sheet without a pattern may be used.

The superconducting gradient shield coils for x and y gradients have substantially the same coil patterns, but are rotated 90° relative to each other. To this end, a second superconducting gradient coil of the design shown in FIG. 2 is created and laminated to the cylinder 72 offset 90° from the first. Again, the coil assembly can be deposited on a flexible, dielectric film which is laminated over the first coil assembly, but 90° offset. To shield z gradient magnetic fields, a plurality of circumferential loops 76 are provided peripherally around the former 72. In the illustrated embodiment, a plurality of loops 76 of a low temperature superconductor are formed on the interior bore of the former 72 at regular intervals along its length. Optionally, the annular z gradient coils can be deposited on a thin film which is laminated around the periphery of the former 72 over top of the x and y gradient shield coils.

Although the superconducting gradient shield coils are disclosed as being constructed of a low temperature superconductor disposed in the helium reservoir 60, it is to be appreciated that higher temperature superconductors may be used, allowing the shield coils to be placed in the same temperature zone as the first or second cold shield. For example, a high temperature superconductor gradient shield coil 70 which is superconducting around liquid nitrogen temperatures, is optionally mounted on a bore side surface of the first cold shield inner coil 44a. As yet another option, the cylindrical former on which the gradient shield coils are supported can be constructed of a plastic reinforced with highly conductive fibers which function as the cold shield.

As yet another option, the superconducting gradient shield coil can be connected with the gradient field control 16 to receive current pulses like those supplied to the gradient coils 14 but of an appropriate magnitude. For example, the gradient shield coil can be connected in series with the gradient coils to assure that the two currents are exactly the same. However, the connection is made such that the current flows are in opposite annular directions to provide current flows of the opposite sense. Optionally, the amount of current flowing to the superconducting gradient shield coil may be reduced with a current divider or the like.

Various other options are also contemplated. For example, a small segment of non-superconducting material may be incorporated into the gradient shield coil to attenuate any residual currents that might occur from stray fields or if the induced currents at the beginning and end of the gradient pulse do not match precisely. The resistive material should be sufficiently small that negligible attenuation occurs during the duration of a normal magnetic field gradient pulse. Optionally, other quenching mechanisms may be provided, such as a superconducting switch which is externally controllable to open the superconducting path or shunt it through a resistance quenching the superconducting current.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiment, the invention is now claimed to be:

1. A magnetic resonance apparatus comprising:
   a radio frequency coil disposed around an examination region;
   a means for causing the radio frequency coil to emit radio frequency resonance excitation and manipulation pulses;
   a gradient coil assembly disposed adjacent and around the examination region;
   a means for supplying current pulses to the gradient coil assembly to cause the generation of magnetic field gradient pulses;
   a generally cylindrical superconducting magnet assembly defining a central bore within which the radio frequency and the gradient coil assemblies are disposed, the superconducting magnet assembly including:
   a cylindrical vacuum vessel;
   at least one annular superconducting magnet disposed within the vacuum vessel;
   an annular, low temperature reservoir surrounding the annular superconducting magnet for containing a medium for holding the superconducting magnet at or below its superconducting temperature, the low temperature reservoir being disposed within and sealed from the vacuum vessel;
   a superconducting gradient shield coil assembly.

2. The apparatus as et forth in claim 1 wherein the superconducting gradient shield coil assembly is disposed within the low temperature reservoir.

3. The apparatus as set forth in claim 2 wherein the superconducting gradient shield coil assembly is inductively coupled to the gradient coil assembly to be driven by gradient magnetic fields emanating therefrom.

4. The apparatus as set forth in claim 1 wherein the superconducting gradient shield coil assembly is inductively coupled to the gradient coil assembly to be driven by gradient magnetic fields emanating therefrom.

5. The apparatus as set forth in claim 1 further including at least one cold shield disposed between the low temperature reservoir and the vacuum vessel, the cold shield having at least one generally cylindrical inner portion between the low temperature reservoir and the bore and at least one generally cylindrical outer portion disposed around an exterior of the low temperature reservoir.

6. The apparatus as set forth in claim 5 wherein the superconducting gradient shield coil assembly is constructed of a high temperature superconductor and disposed in thermal communication with the cold shield inner cylindrical portion.

7. The apparatus as set forth in claim 5 further including a main magnet shield coil disposed circumferentially around the annular superconducting magnet for shielding an area around the superconducting magnet assembly from the magnetic field generated by the annular superconducting magnet.

8. The apparatus as set forth in claim 7 wherein the main magnetic field shield coil is disposed in the low temperature reservoir.

9. The apparatus as set forth in claim 8 wherein the superconducting gradient shield coil assembly is disposed in the low temperature reservoir inside the annular superconducting magnet.

10. The apparatus as set forth in claim 1 further including a reconstruction means for reconstructing an image representation from magnetic resonance signals received in the bore of the superconducting magnet assembly.

11. The apparatus as set forth in claim 1 wherein the superconducting gradient shield coil assembly is disposed within the vacuum vessel.

12. A generally cylindrical superconducting magnet assembly comprising:
   a cylindrical vacuum vessel defining a central bore therein;
   annular superconducting magnets disposed within the vacuum vessel;
   a generally cylindrical low temperature reservoir surrounding the annular superconducting magnets for containing a medium for holding the superconducting magnet below its superconducting temperature, the low temperature reservoir being disposed within and sealed from the vacuum vessel;
   a superconducting gradient shield coil assembly disposed within the vacuum vessel for being driven by gradient magnetic fields to create shielding magnetic fields that inhibit the gradient magnetic fields from inducing eddy currents.

13. The assembly as set forth in claim 12 wherein the superconducting gradient shield coil assembly is disposed within the low temperature reservoir.

14. The assembly as set forth in claim 12 further including at least one cold shield disposed between the low temperature reservoir and the vacuum vessel, the cold shield having at least one generally cylindrical inner portion between the low temperature reservoir and the bore and at least one generally cylindrical outer portion disposed around an exterior of the low temperature reservoir.

15. The assembly as set forth in claim 12 further including a main magnet shield coil disposed circumferentially around the annular superconducting magnet for shielding an area around the superconducting magnet assembly outside of the bore from the magnetic field generated by the annular superconducting magnet.

16. The assembly as set forth in claim 15 wherein the main magnetic field shield coil is disposed in the low temperature reservoir.

17. The assembly as set forth in claim 16 wherein the superconducting gradient shield coil assembly is disposed in the low temperature reservoir inside the annular superconducting magnet.

* * * * *